US005969554A

United States Patent [19]
Chan et al.

[11] Patent Number: 5,969,554
[45] Date of Patent: Oct. 19, 1999

[54] MULTI-FUNCTION PRE-DRIVER CIRCUIT WITH SLEW RATE CONTROL, TRI-STATE OPERATION, AND LEVEL-SHIFTING

[75] Inventors: Francis H. Chan, Williston; Douglas Willard Stout, Milton, both of Vt.

[73] Assignee: International Business Machines Corp., Armonk, N.Y.

[21] Appl. No.: 08/871,743

[22] Filed: Jun. 9, 1997

[51] Int. Cl.$^6$ .............................. H03K 5/12; H03K 17/16; H03L 5/00

[52] U.S. Cl. .......................... 327/170; 327/333; 327/185; 327/389; 326/27; 326/58; 326/68

[58] Field of Search .................................. 326/80, 81, 26, 326/27, 57, 58, 68; 327/333, 185, 108, 170, 384, 389

[56] References Cited

U.S. PATENT DOCUMENTS

| | | | |
|---|---|---|---|
| 4,791,312 | 12/1988 | Weick | 327/333 |
| 4,926,071 | 5/1990 | MacMillan et al. | 326/69 |
| 5,144,165 | 9/1992 | Dhong et al. | 326/80 |
| 5,293,081 | 3/1994 | Chiao et al. | 327/108 |
| 5,300,828 | 4/1994 | McClure | 327/374 |
| 5,382,838 | 1/1995 | Sasaki et al. | 327/108 |
| 5,469,082 | 11/1995 | Bullinger et al. | 326/83 |
| 5,528,172 | 6/1996 | Sundstrom | 326/80 |
| 5,537,070 | 7/1996 | Risinger | 327/170 |
| 5,539,334 | 7/1996 | Clapp, III et al. | 326/68 |
| 5,563,539 | 10/1996 | Takase | 327/185 |
| 5,568,081 | 10/1996 | Lui et al. | 327/380 |
| 5,623,216 | 4/1997 | Penza et al. | 326/27 |
| 5,682,116 | 10/1997 | Dreibelbis et al. | 327/333 |
| 5,739,726 | 4/1998 | Ling | 326/81 |
| 5,757,217 | 5/1998 | Thompson | 327/170 |
| 5,777,944 | 7/1998 | Knaack et al. | 326/27 |

OTHER PUBLICATIONS

"Tristate Programmable Driver Circuit," *IBM Technical Disclosure Bulletin*, vol. 20, No. 2, pp. 766–768, Jul. 1977.
"CMOS Driver Circuit," *IBM Technical Disclosure Bulletin*, vol. 30, No. 2, pp. 770–771, Jul. 1987.

*Primary Examiner*—Timothy P. Callahan
*Assistant Examiner*—Terry L. Englund
*Attorney, Agent, or Firm*—Eugene I. Shkurko

[57] ABSTRACT

A pre-driver circuit in an I/O circuit for an integrated circuit performs the combined functions of voltage level shifting, slew rate control, and tri-state capability, in a single circuit to avoid additional delay caused by implementing any combination of these functions in two or more circuits.

16 Claims, 2 Drawing Sheets

MULTI-FUNCTION PRE-DRIVER CIRCUIT WITH SLEW RATE CONTROL, TRI-STATE OPERATION, AND LEVEL-SHIFTING

FIELD OF THE INVENTION

The present invention relates to input/output circuits for integrated circuits which include a pre-drive circuit and an off-chip driver circuit.

BACKGROUND OF THE INVENTION

In integrated circuit technology, devices in different integrated circuit (hereinafter referred to as "IC") packages are interconnected to one another at I/O PADS associated with each IC package. I/O PADS are associated with electrical circuits which perform a desired function to interface with other IC packages or electrical devices. An I/O PAD may be associated with electrical circuits which generate output signals and apply the signals to the I/O PAD for external devices to sense and process accordingly. Alternatively, an I/O PAD may be associated with electrical circuits which sense the logic state of signals applied to the I/O PAD by external electrical circuits or IC packages. I/O PADS are frequently "bi-directional" in the sense that they may be used at different times for the sensing of input signals to the IC package or for the application of output signals from the IC package. Electrical output signals are applied to an I/O PAD by electrical circuits within the IC package associated with the I/O PAD. Similarly, electrical input signals are received as input signals from an I/O PAD by associated electrical circuits within the IC package which "sense" the signal level and operate accordingly.

It is common for such interconnected circuits to utilize standard voltage levels to represent logic states of 0 and 1 (or "on" and "off"). Common standard voltage levels in the past have been 0 Volts (± a threshold value) to represent one logic state and 3 Volts (more precisely, 3.3 Volts ± a threshold value) to represent the other logic state. As new IC manufacturing technologies evolve, the voltage levels used may change. For example, in the manufacture of many current IC devices using submicron semiconductor fabrication processes, the semiconductor industry has begun to standardize on 2.5 Volt (± a threshold value) in place of 3 Volt signal levels to improve performance and reduce power dissipation. The lower voltage level permits reduced thickness in transistor gate oxide materials to thereby reduce switching time of transistor gates and improve performance of the switching circuitry. As a result, input/output circuits fabricated in a 2.5 Volt CMOS technology must include circuitry for interfacing to a 3.3 Volt circuit by shifting 2.5 Volt signals to 3.3 Volt signals or, in other words, transforming a signal ranging from 0 to 2.5 Volts into a signal which ranges from 0 to 3.3 Volts. This transformation of the signal is referred to as "voltage level shifting." Due to the bidirectional nature of input/output circuits, these circuits must also include a tri-state function which enables the output of a driver for outputting information from the IC package and disables the output of the driver by putting the output of the driver in a high impedance mode when information is being inputted into the integrated circuit package.

Drivers in such input/output circuits must also include slew rate control for reducing noise. Existing driver circuits for input/output circuits have separate functions for performing voltage level shifting slew rate control or tri-state capability or some combination of the three functions. By putting these functions into multiple stages, significant delay is introduced into the I/O circuit.

What is needed is an input/output circuit including a pre-drive circuit which incorporates all three functions, i.e., the level shifting function, slew rate control function, and the tri-state function in a single circuit to avoid delay introduced by putting those functions into multiple stages.

SUMMARY OF THE INVENTION

Accordingly, the present invention provides an I/O circuit for an integrated circuit comprising a pre-driver circuit. The pre-driver circuit includes an input for receiving an input signal having a first voltage range and an output for transmitting an output signal having a second voltage range in response to the input signal wherein the output signal has a second voltage range. The pre-driver circuit further includes slew rate control means for controlling the slew rate of the output signal, tri-state means for enabling the input and output in response to a tri-state input signal, and a level shifter means for changing the first voltage range of the input signal to the second voltage range of the output signal.

The present invention provides the advantage of combining the level shifting function, slew rate control function, and tri-state function into a single pre-driver circuit to reduce delay.

The present invention provides the advantage of faster performance than separate level shift, slew rate control and tri-state capability circuits.

The present invention provides the advantage of protecting I/O circuits by including a voltage level shift.

DETAILED DESCRIPTION OF A PREFERRED EMBODIMENT OF THE INVENTION

Figure 1:
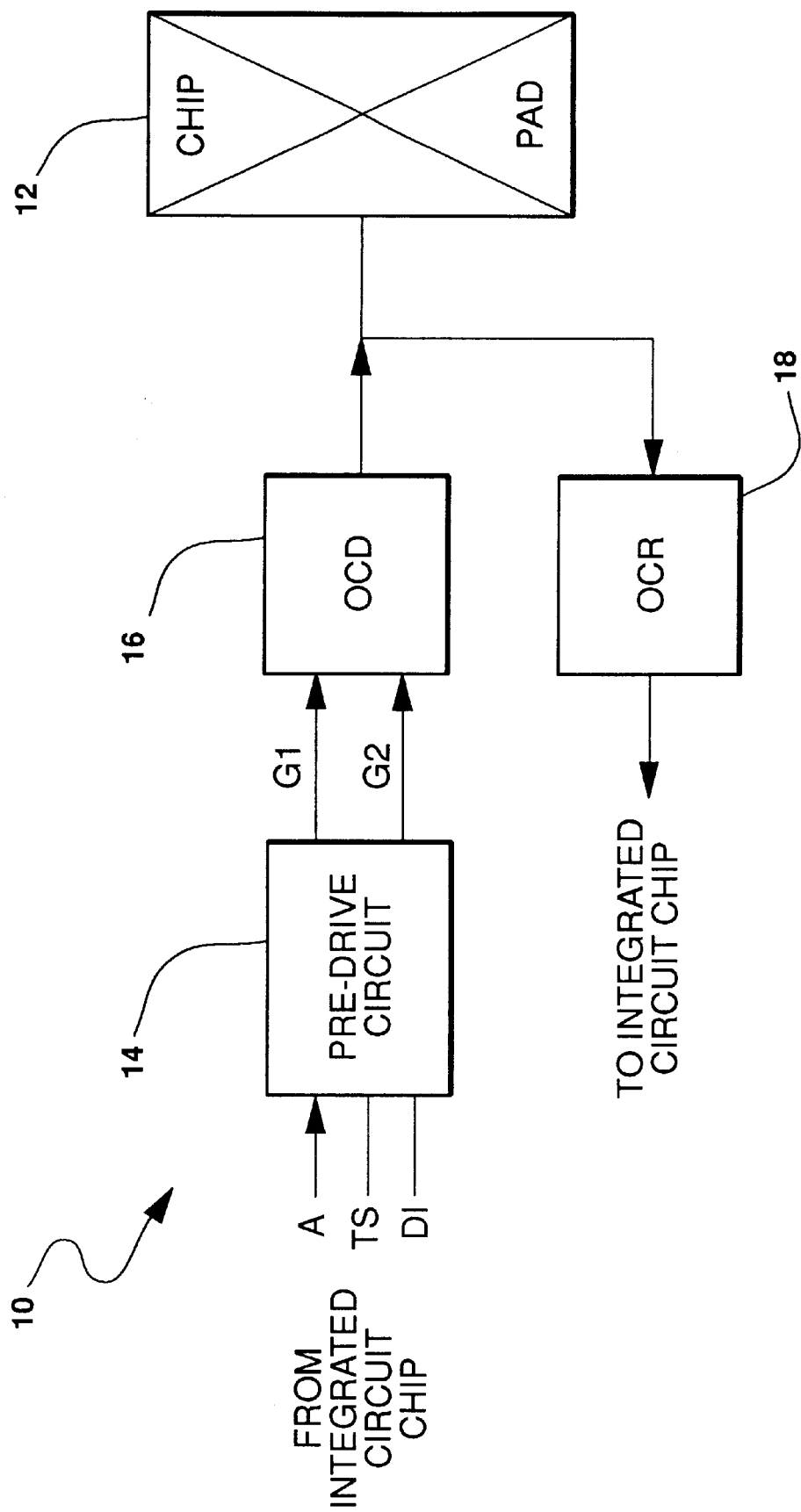
FIG. 1 is a block circuit diagram of an I/O pad and associated functional I/O circuitry according to the present invention.

FIG. 1 illustrates a representative I/O circuit 10 for practicing the present invention. I/O circuit 10 is for an integrated circuit operating within a first voltage range such as 0 to 2.5 Volts for a CMOS-based technology. I/O circuit 10 includes an I/O pad 12 for inputting or outputting electrical signals to or from external circuits (not shown) such as an integrated circuit. Thus, input/output pad 12 is bidirectional. Input/output circuit 10 further includes pre-drive circuit 14, off-chip driver 16, and off-chip receiver 18.

Figure 2:
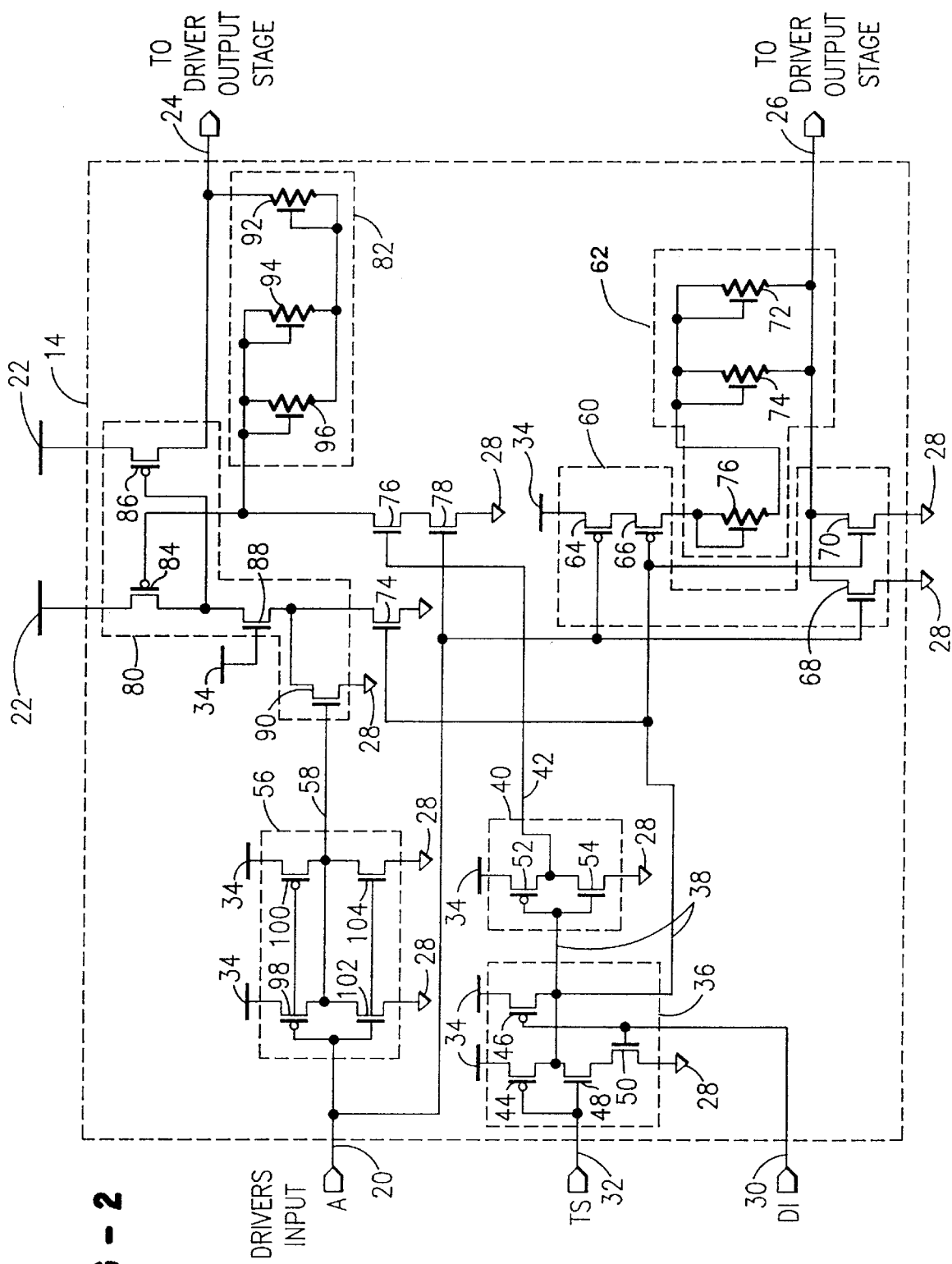
FIG. 2 is a circuit diagram of a pre-drive circuit in the I/O circuit of FIG. 1 according to the present invention.

Referring now to FIG. 2, an I/O circuit according to the present invention is shown, and in particular, a pre-drive circuit 14 is shown to reveal the present invention. Pre-drive circuit 14 includes an input 20 for receiving an input signal having a first voltage range from 0 Volts to 2.5 Volts. Pre-drive circuit 14 further includes a first voltage source input 22 for inputting the operating voltage of pre-drive circuit 14 which, in the preferred embodiment, is 3.6 Volts.

Pre-drive circuit 14 further includes a first output 24 for outputting a first output signal having a second voltage range ranging from 0 to 3.6 Volts and a second output 26 for outputting a second output signal having the same voltage range of the input signal or, in other words, 0 to 2.5 Volts. Pre-drive circuit 14 further includes a ground input 28, a disable input 30, and a tri-state input 32. Ground input 28 is preferably at 0 Volts. Both disable input 30 and tri-state input 32 input signals ranging from 0 to 2.5 Volts.

Pre-drive circuit 14 is preferably used in an input/output circuit 10 using CMOS technology having an internal voltage regulator that regulates from an external voltage of 3.6 Volts to an internal voltage of 2.5 Volts. In the following description, VDDE is the externally applied voltage at 3.6 Volts as applied at first voltage source input 22, and VDDI is the internally regulated voltage of 2.5 Volts represented by second voltage source 34.

Pre-drive circuit 14 further includes an AND gate 36 having as inputs disable input 30 and tri-state input 32. AND gate 36 has an $\overline{EN}$ output 38. $\overline{EN}$ output 38 is coupled to the input of an inverter 40 to generate an EN output 42. AND gate 36 consists of transistors 44, 46, 48, and 50. Transistors 44 and 46 are P-type transistors, while transistors 48 and 50 are N-type transistors. Inverter 40 comprises transistors 52 and 54. Transistor 52 is a P-type transistor, while transistor 54 is an N-type transistor configured to form an inverter circuit as is well known in the art. Together, AND gate 36 and inverter 40 form a NAND gate.

Pre-drive circuit 14 further includes a second inverter circuit 56 having as an input, input 20, and having an output 58. Pre-drive circuit 14 further includes a NOR gate 60. NOR gate 60 has as inputs, input 20 and $\overline{EN}$ output 38 from AND gate 36. The output of NOR gate 60 is coupled to a second output slew rate or DI/DT control 62 which operably couples NOR gate 60 to second output 26. NOR gate 60 comprises transistors 64, 66, 68, and 70. Transistors 64 and 66 are P-type transistors, while transistors 68 and 70 are N-type transistors.

Second output slew rate control 62 comprises three variable resistors 72, 74, 76. Second output 26 is coupled to off-chip driver 16 and, in particular, to an NFET (not shown). Pre-drive circuit 14 further includes N-type transistors 74 and 76. Transistor 74 has its gate coupled to the output 38 of AND gate 36, and transistor 76 has its gate coupled to the output 42 of inverter 40. Since output 42 is the complement of output 38, transistor 74 is off, while transistor 76 is on, and vice versa.

As will be explained in further detail in the description of the operation of pre-drive circuit 14, transistors 74 and 76 perform the function of tri-state control in response to a tri-state input signal inputted into tri-state input 32 and a disable signal inputted into disable input 30 for controlling enabling or disabling of input 20 and output 24. Pre-drive circuit 14 further includes transistor 78 having its gate coupled to input 20, its source coupled to the drain of transistor 76, and its drain coupled to ground. The drain of transistor 74 is also coupled to ground. The sources of transistors 74 and 76 are operably coupled to a level shifter circuit 80. The source of transistor 76 is also coupled to first output slew rate control or DI/DT control circuit 82.

Level shifter circuit 80 performs the function of transforming or changing the voltage range at input 20 or, more specifically, at the output 58 of second inverter circuit 56 from a first voltage range of 0 to 2.5 Volts to a second voltage range of 0 to 3.6 Volts at first output 24. Thus, level shifter circuit 80 shifts the upper limit of the voltage range at input 20 from 2.5 Volts to 3.6 Volts. This ensures successful operation of off chip driver 16 which requires 3.6 Volts.

First output slew rate control circuit 82 controls the slew rate of the first output signal outputted at output 24. Level shifter circuit 80 comprises transistor 84, transistor 86, transistor 88, and transistor 90. Transistors 84 and 86 are P-type transistors, while transistors 88 and 90 are N-type transistors. The sources of transistors 84 and 86 are coupled to VDDE or 3.6 Volts to provide the shift to the upper limit of the voltage of the input signal inputted at input 20. The gate of transistor 84 is coupled to the source of transistor 76 and also to first output slew rate control circuit 82. The gate of transistor 86 is coupled to the drain of transistor 84. The drain of transistor 86 is coupled to the first output 24. The gate of transistor 88 is coupled to VDDI or 2.5 Volts. The source of transistor 88 is coupled to the drain of transistor 84 and the gate of transistor 86. The drain of transistor 88 is coupled to the source of transistor 74 and to the source of transistor 90. The gate of transistor 90 is coupled to the output of second inverter circuit 56. The drain of transistor 90 is coupled to ground 28.

First outputs of control circuit 82 includes variable resistors 92, 94, 96. A first contact of variable resistor 92 is coupled to output 24. Variable resistor 92 also includes a second contact and a third contact coupled to the second contact. Variable resistor 94 includes a first contact coupled to the second and third contacts of variable resistor 92. Variable resistor 94 also includes a second contact and a third contact coupled to the second contact. Variable resistor 96 includes a first contact coupled to the first contact of variable resistor 94. Variable resistor 96 includes a second contact and a third contact coupled to the second contact and also coupled to the second and third contacts of variable resistor 94. The second and third contacts of variable resistor 96 are also coupled to the gate of transistor 84 of the level shifter circuit 80 and to the source of transistor 76. The second inverter circuit includes P-transistors 98, 100, and N-type transistors 102 and 104.

In operation, disable input 30 inputs a disable signal having a voltage range from 0 to 2.5 Volts. The disable input signal controls disablement of off-chip driver 16 during a test mode. A logic 1 for the disable input signal indicates that the test mode is deactivated, and a logic 0 indicates that the test mode is activated. During the activated test mode, no input signal from input 20 can be transmitted to off-chip driver output 12, since the off-chip driver 16 is in a high impedance state. When not in the test mode, the tri-state input signal controls whether the off-chip driver 16 is in an active mode or an inactive mode.

In the active mode, the input signal is transmitted from input 20 to first output 24. In the inactive mode, pre-driver circuit 14 ignores any input signal at input 20 and places off-chip driver 16 in a high impedance state. When the tri-state input signal is logic 1, pre-drive circuit 14 is placed in the active mode. When tri-state input signal is a logic 0, the pre-drive circuit is in an inactive mode.

Transistor 74 is always off when tri-state input 32 is in the active mode, and transistor 76 is always on when tri-state input 32 is in the active mode. With transistor 74 being off in the active mode, level shifter circuit 80 is activated and ready for operation. In a similar manner, with transistor 76 being on in the active mode, first output slew rate control circuit 82 stands ready for operation and receipt of an input signal via input 20. Upon receipt of an input signal at input 20, transistor 78 is turned on, creating a path to ground for first slew rate control circuit 82 through transistor 76. In the active mode, an input signal inputted via input 20 is outputted as an output signal via output 24 in approximately 1,000 pico seconds.

Although the present invention and its advantages have been described in detail, it should be understood that various changes, substitutions and alterations can be made herein without departing from the spirit or scope of the invention as defined in the appended claims.

What is claimed is:

1. An I/O circuit for an integrated circuit (IC) chip, comprising:
   a pre-driver circuit including:
      an input for receiving an input signal having a first voltage range;
      an output for transmitting an output signal corresponding to said input signal, said output signal having a second voltage range;
      a level shifter circuit receiving said input signal for shifting said first voltage range of said input signal to said second voltage range of said output signal, and coupled directly to the output for providing said output signal to the output;
      a slew rate control circuit coupled directly to the output in parallel with the level shifter circuit for controlling a slew rate of said output signal; and
      a tri-state circuit coupled to both the level shifter circuit and to the slew rate control circuit for activating said level shifter circuit and said slew rate control circuit in response to a tri-state input signal.

2. The I/O circuit, as recited in claim 1, further comprising an off-chip driver circuit operably coupled to said output of said pre-driver circuit.

3. The I/O circuit, as recited in claim 1, wherein said pre-driver circuit further includes a second output activated by the input signal and the tristate input signal for transmitting a second output signal corresponding to said input signal, said second output signal having said first voltage range.

4. The I/O circuit, as recited in claim 1, wherein said slew rate control circuit includes a resistance circuit coupling the output to ground for effectuating said controlling the slew rate of said output signal.

5. The I/O circuit, as recited in claim 4, wherein said resistance circuit includes:
   a first resistance means having a first contact coupled to said output, a second contact and a third contact coupled to said second contact;
   a second resistance means having a first contact coupled to said second and third contacts of said first resistance means, a second contact and a third contact coupled to said second contact; and
   a third resistance means having a first contact coupled to said first contact of said second resistance means, a second contact and a third contact coupled to said second contact.

6. The I/O circuit, as recited in claim 1, wherein said tri-state circuit includes means for responding to a second tri-state input signal for deactivating the level shifter circuit and the slew rate control circuit, thereby placing the output in a high impedance state.

7. The I/O circuit, as recited in claim 1, wherein said pre-driver circuit further includes:
   a transistor having a first contact coupled to said slew rate control circuit, a second contact coupled to said input, and a third contact coupled to ground for coupling the slew rate control circuit to ground in response to the input signal.

8. A pre-driver circuit comprising:
   an input for receiving an input signal having a first voltage range;
   an output for transmitting an output signal corresponding to said input signal, said output signal having a second voltage range;
   a level shifter circuit receiving said input signal for shifting said first voltage range of said input signal to said second voltage range of said output signal, and coupled directly to the output for providing said output signal to the output;
   a slew rate control circuit coupled directly to the output in parallel with the level shifter circuit for controlling a slew rate of said output signal; and
   a tri-state circuit coupled to both the level shifter circuit and to the slew rate control circuit for activating said level shifter circuit and said slew rate control circuit in response to a tri-state input signal.

9. The pre-driver circuit, as recited in claim 8, further comprising a driver circuit operably coupled to said output of said pre-driver circuit.

10. The pre-driver circuit, as recited in claim 8, wherein said pre-driver circuit further includes a second output activated by the input signal and the tristate input signal for transmitting a second output signal corresponding to said input signal, said second output signal having said first voltage range.

11. The pre-driver circuit, as recited in claim 8, wherein said slew rate control circuit includes a resistance circuit coupling the output to ground for effectuating said controlling the slew rate of said output signal.

12. The pre-driver circuit, as recited in claim 11, wherein said resistance circuit includes:
   a first resistance means having a first contact coupled to said output, a second contact and a third contact coupled to said second contact;
   a second resistance means having a first contact coupled to said second and third contacts of said first resistance means, a second contact and a third contact coupled to said second contact; and
   a third resistance means having a first contact coupled to said first contact of said second resistance means, a second contact and a third contact coupled to said second contact.

13. The pre-driver circuit, as recited in claim 8, wherein said tri-state circuit includes means for responding to a second tri-state input signal for deactivating the level shifter circuit and the slew rate control circuit, thereby placing the output in a high impedance state.

14. The pre-driver circuit, as recited in claim 8, further comprising:
   a transistor having a first contact coupled to said slew rate control circuit, a second contact coupled to said input, and a third contact coupled to ground for coupling the slew rate control circuit to ground in response to the input signal.

15. An I/O circuit for an integrated circuit comprising:
   a pre-driver circuit including:
      an input for receiving an input signal having a first voltage range;
      an output for transmitting an output signal in response to said input signal, said output signal having a second voltage range;
      slew rate control means for controlling the slew rate of said output signal;
      tri-state means for activating said pre-driver circuit in response to a tri-state input signal; and
      level shifter means for changing said first voltage range of said input signal to said second voltage range of said output signal; and
      wherein said level shifter means includes:
         a first transistor having a first contact coupled to a first voltage source, a second contact coupled to said output, and a third contact;

a second transistor having a first contact coupled to said first voltage source, a second contact coupled to said third contact of said first transistor, and a third contact;

a third transistor having a first contact coupled to said third contact of said first transistor and to said second contact of said second transistor, a second contact, and a third contact coupled to a second voltage source; and a fourth transistor having a first contact coupled to said second contact of said third transistor, a second contact coupled to ground, and a third contact for receiving the input signal.

16. The I/O circuit, as recited in claim 15, wherein said third contact of said second transistor, said first contact of said fourth transistor, and said second contact of said third transistor are operably coupled to said tri-state means; and wherein said third contact of said second transistor is also operably coupled to said slew rate control means.

* * * * *